US008256109B2

(12) United States Patent
Niklas et al.

(10) Patent No.: US 8,256,109 B2
(45) Date of Patent: Sep. 4, 2012

(54) METHOD FOR CHECKING AND ROTATING ELECTRONIC COMPONENTS

(75) Inventors: Sigmund Niklas, Zell-Beucerling (DE);
Rene Glas, Cham (DE); Manfred Brandl, Rimbach-Kellersdorf (DE);
Franz Brandl, Sattelnpeilstein (DE)

(73) Assignee: Muhlbauer AG, Roding (DE)

( * ) Notice: Subject to any disclaimer, the term of this patent is extended or adjusted under 35 U.S.C. 154(b) by 655 days.

(21) Appl. No.: 12/436,433

(22) Filed: May 6, 2009

(65) Prior Publication Data

US 2009/0213365 A1    Aug. 27, 2009

Related U.S. Application Data

(62) Division of application No. 10/589,429, filed as application No. PCT/EP2005/050388 on Jan. 31, 2005, now Pat. No. 7,603,765.

(30) Foreign Application Priority Data

Feb. 16, 2004   (DE) .................. 10 2004 007 703

(51) Int. Cl.
*H05K 3/30* (2006.01)

(52) U.S. Cl. ........ 29/834; 29/740; 414/223.03; 414/759

(58) Field of Classification Search ............. 414/223.02, 414/759, 771; 29/709, 720, 739, 740, 832–834
See application file for complete search history.

(56) References Cited

U.S. PATENT DOCUMENTS

| | | | |
|---|---|---|---|
| 4,151,945 A | | 5/1979 | Ragard et al. |
| 4,759,675 A | | 7/1988 | Bond et al. |
| 4,915,565 A | * | 4/1990 | Bond et al. ........... 29/740 |
| 5,007,162 A | | 4/1991 | Weeber |
| 5,233,745 A | | 8/1993 | Morita |
| 6,311,391 B1 | | 11/2001 | Fuke et al. |
| 6,507,996 B1 | | 1/2003 | Schweitzer |
| 7,047,632 B2 | | 5/2006 | Arikado |
| 7,356,919 B2 | | 4/2008 | Hata et al. |
| 2003/0071109 A1 | | 4/2003 | Arikado |
| 2003/0161711 A1 | | 8/2003 | Kwan |

FOREIGN PATENT DOCUMENTS

| | | |
|---|---|---|
| EP | 1057388 | 10/2001 |
| JP | 11-297749 | 10/1999 |
| KR | 2000-0035067 | 6/2000 |
| WO | WO 99/43192 | 8/1999 |
| WO | WO 03/058708 | 7/2003 |

OTHER PUBLICATIONS

Korean Office Action for Application No. 10-2006-7004017 dated Sep. 27, 2007.

* cited by examiner

*Primary Examiner* — Donghai D. Nguyen
(74) *Attorney, Agent, or Firm* — Muncy, Geissler, Olds & Lowe, PLLC (57) ABSTRACT

A device for inspecting and rotating electronic components, particularly flip chips, includes a component which is rotatably mounted at a position of rotation and which is used to rotate electric components. A first receiving element is fixed to the outer side of the component in order to receive a single electronic component of a carrier and to secure it during a rotational movement of the component. A second receiving element is arranged on the outer side of the component opposite the first receiving element in relation to the point of rotation such that when the component is rotated by 180° it respectively faces the carrier, and a through opening is arranged in the component between the receiving elements such that when the component is rotated by 90° or 270° the through opening faces the carrier. Also a method for inspecting and rotating electronic components, particularly flip chips.

14 Claims, 8 Drawing Sheets

METHOD FOR CHECKING AND ROTATING ELECTRONIC COMPONENTS

CROSS-REFERENCE TO RELATED APPLICATIONS

This application is a divisional application of U.S. application Ser. No. 10/589,429, filed Nov. 3, 2006, now issued as U.S. Pat. No. 7,603,765, which is a U.S. National phase application of PCT/EP2005/050388, filed Jan. 31, 2005, which claims priority to DE 10 2004 007 703.7, filed Feb. 16, 2004, the disclosure of which are hereby incorporated herein by reference in their entirety.

BACKGROUND OF THE INVENTION

1. Field of the Invention

The invention relates to a device and a method for checking and rotating electronic components, in particular flip chips, with a pivoting part attached to a pivotal point for rotating the electronic components, a first pickup element being fixed on the exterior of the part for picking up a single electronic component from a substrate and keeping hold of it during a rotational movement of the part.

2. Description of Related Art

For methods that are based on a flip chip principle, it is known that individual electronic component parts arranged in a sandwich separated from one another, such as semiconductor chips arranged in a wafer, the wafer in turn being set on an extensible carrier sheet, are picked up from this carrier sheet and rotated, i.e. turned upside down, in order to deposit them in the rotated position for the subsequent die bond or die sort. For this purpose, the single chip is first detached from the reverse side of the carrier sheet with a needle, the so-called die ejector, and transferred with a pickup element, such as a vacuum pipette, advanced from the front or from above. For this, the vacuum pipette is usually arranged as a flip tool on a flip head of a part pivoting about a pivotal point, and keeps hold of the selected chip during a 180° rotation of the pivoting part. After the 180° rotation has taken place, the chip turned round in this way is picked up by a pick-and-place element on its reverse side, in order then to transport the chip in this rotated situation to the desired position, for example within a smart card module.

In order to check the surface of the individual chip still arranged on the substrate for intactness before it is picked up, and at the same time to be able to check that it is in the correct position before it is picked up, a first optical facility, for example a camera, is arranged above the pivoting part for the inspection of the wafer. Since an optical connection line set up perpendicular to the surface of the wafer and the chip between the first optical facility and the wafer surface is important for an optimized check, the camera is arranged directly over the chip to be picked up. For this reason, the pivoting part must be rotated out of the perpendicularly running optical connection line each time before a chip is picked up, in order that a so-called wafer inspection can be performed.

This results in the following sequentially occurring method sequence for each flip chip: First, a check of the surface of the chip to be picked up must be performed using the camera. The flip head is then rotated into the optical connection line, in order to pick up the chip by its upper surface using the vacuum pipette attached to the flip head. By means of the pivoting part, whose rotational axis is arranged outside the optical connection line, the chip is now rotated through 180° in such a way that the flip head is now in a rotated position outside the optical connection line. A further check performed on the chip's position by means of a second optical facility in the form of a camera should supply data on a flip offset of the flipped chip. The flipped or rotated chip is then transferred to a placing facility in the form of a place head, and a correction is made to the flip offset based on transferred correction values.

Such a sequence of successive steps leads to a high time requirement for the overall process of checking and rotating a chip, and thereby reduces the throughput of the device. It therefore also results in higher operating costs.

BRIEF SUMMARY OF THE INVENTION

The present invention is therefore based on the object of providing a device and a method for checking and rotating electronic component parts, in particular flip chips, with a pivoting part for rotating the components, the device and the method being time-and cost-saving.

An essential point of the invention is that in a device for checking and rotating electronic components, such as flip chips, with a pivoting part attached to a pivotal point for rotating the electronic components, on the exterior of which part a first pickup element is fixed for taking up a single component from a substrate and keeping hold of it during a rotational movement, a second pickup element is arranged externally on the part opposite the first pickup element in relation to the pivotal point in such a way that in each case one pickup element is facing the substrate for each rotation of the part through 180°. The part further has a through opening between the pickup elements such that the through opening is facing the substrate for a rotation of the pivoting part through 90° or 270°. In this way, during a 180° rotation of the pivoting part, first the chip can be picked up from the substrate by the first pickup element, developed for example as a vacuum pipette, after a rotation through the first 90° an optical connection line between a first optical facility arranged above the pivoting part for checking the surface and the correct position of a further chip arranged on the substrate based on the vertically aligned through opening, and a depositing of the chip on a placing facility likewise arranged relocatably above the pivoting part can take place, the chip meanwhile turned round after an executed 180° rotation. At the same time, by means of the second pickup element which can likewise be developed as a vacuum pipette, the further component is picked up from the substrate, since the second pickup element is now arranged over the wafer surface. A subsequent 180° rotation in the reverse direction of the pivoting part results in a further execution of the process described above.

Since a wafer inspection, a pickup and a deposit of the chip can occur within a single 180° rotation of the pivoting part developed according to the invention, as well as the turning round of the chip and also the picking up of a further chip, a considerable saving of time is hereby achieved. This considerably increases the throughput of the device as a whole, thereby reducing the operating costs of the device.

According to a preferred embodiment, the first pickup element is fixed to a first projection of the part, and the second pickup element to a second projection. The through opening can then be developed between the projections as a through channel open on one of its long sides. A consequence of this that not only can the vacuum pipettes be fixed optimally to the pivoting part, but a simple manufacture of the through channel by a milling process is also possible, thus enabling economical manufacture. In addition, such a design of the pivoting part means that a rotational axis extending perpendicular to the course of the through channel is arranged not blocking the view for the first optical facility within the through channel.

A second optical facility is preferably arranged in the form of a camera for checking a correct position of the previously rotated and possibly deposited chip, in order that a flip offset can be determined and correction data can accordingly be passed to the placing facility for correcting the chip's position.

The first optical facility is activated with a predefinable time delay after a rotation or swivel of the through opening into the optical connection line between the first optical facility and the chip to be checked, arranged on the substrate. By this means, partially blurred images caused by the projections rotating with the part can reliably be avoided.

Further advantageous embodiments will become apparent from the subclaims.

BRIEF DESCRIPTION OF THE DRAWINGS

Advantages and expediencies can be taken from the following description in conjunction with the drawing. Shown are.

DETAILED DESCRIPTION OF THE INVENTION

Figure 1:
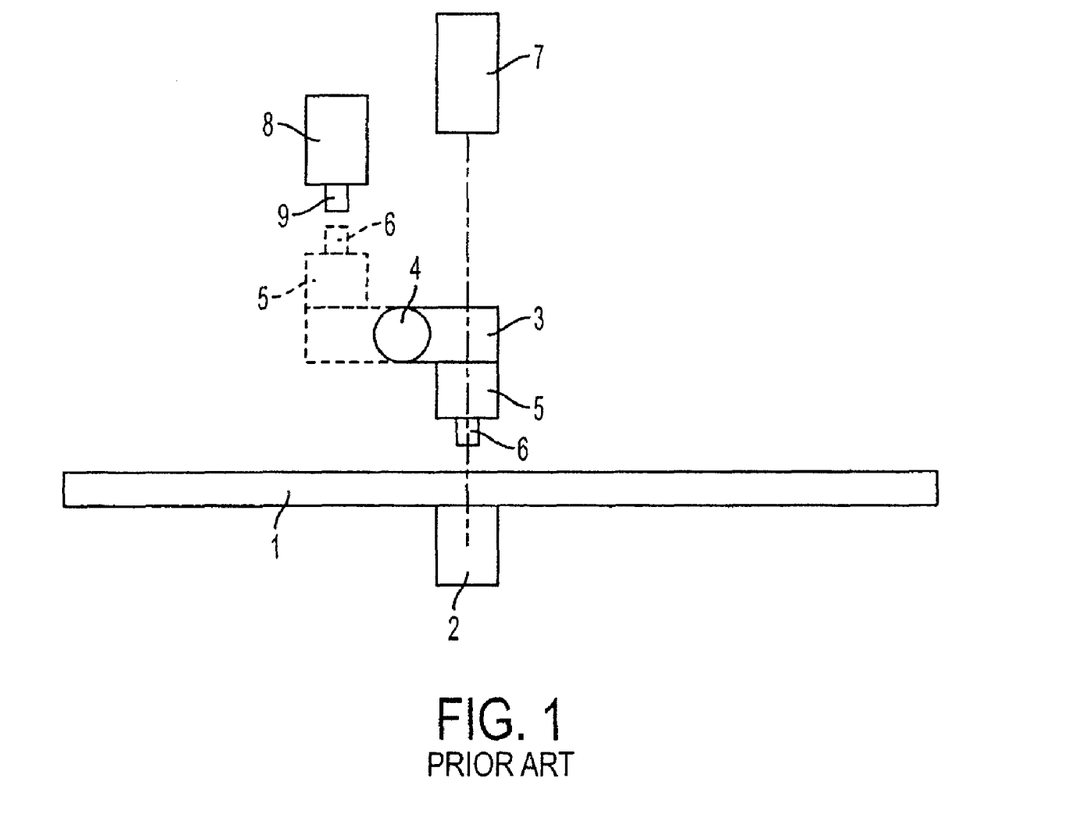
FIG. 1 in a schematic front view, a device for checking and rotating semiconductor chips according to prior art.

As can be seen from FIG. 1 in a schematic front view, previously according to prior art a pivoting part 3 was used for detaching individual semiconductor chips, not shown here, from a wafer or from its substrate 1 by means of a die ejector 2, this part 3 enabling, by the design of a rotational axis projecting into the drawing plane to form a pivotal point 4 at the left-hand end of the part, a swivelling in and out of a flip head 5 with arranged on it a pickup element 6, out of an optical connection line between a first optical facility 7 and the wafer surface. The solid lines of the flip head represent a pickup or pick position of the chip to be picked up, while the dotted lines of flip head 5 reflect a deposit or place position on a placing facility 8 following the pickup process. The placing facility 8 likewise has a pickup element 9, for example in the form of a vacuum pipette, in order to place the now turned chip within a smart card module, for example, by moving the placing facility 8.

A pivoting part of this nature has only one pickup element, for one thing, and for another requires the time-consuming sequential method sequence that has already been described.

Figure 2:
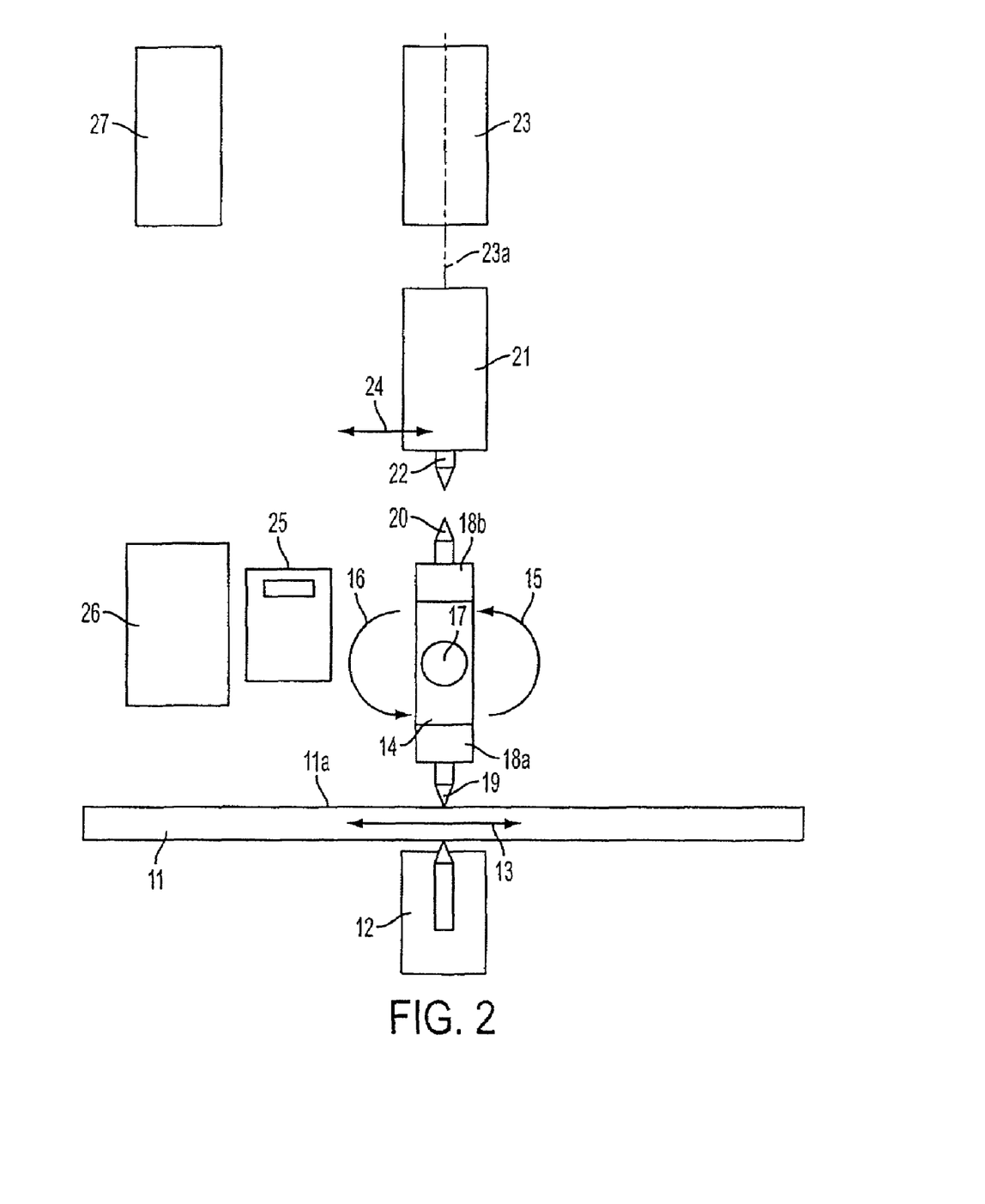
FIG. 2 in a schematic front view, a device for checking and rotating semiconductor chips according to an embodiment of the present invention.

In FIG. 2, a device for checking and rotating semiconductor chips according to an embodiment of the present invention is shown in a schematic front view. It can be seen in this representation that above a wafer and an associated substrate 11 with a wafer surface 11a, from which individual semiconductor chips are ejected with a die ejector 12 from below upwards, a pivoting part 14 is arranged in such a way that it rotates in an executed rotation as indicated by arrows 15, 16 about a pivotal point 17, which is arranged above the chip to be picked up. The wafer can be moved with the substrate 11 in the x or y direction, as is indicated by the double arrow 13.

On cheek projections 18a and 18b the pivoting part 14 has two opposite pickup elements 19, 20—for example in the form of vacuum pipettes—, which enable simultaneous picking up and depositing of two semiconductor chips. The first vacuum pipette 19 can pick up a semiconductor chip from the substrate 11, while the second vacuum pipette 20 deposits a further semiconductor chip on a placing facility 21, which can for example be equipped with a further vacuum pipette 22. The placing facility 21 is then moved sideways as indicated by the double arrow 24.

At almost the same time the pivoting part 14 rotates about its pivotal point 17—this time in the opposite direction to the preceding rotation—and after a 90° rotation a through opening not shown here arranged in the pivoting part 14 generates a sight channel 23a from a first optical facility 23 running vertically through the part 14 to the surface 11a of the substrate 11 covered with the wafer to a further semiconductor chip.

This sight channel is used for carrying out a short-time recording by the first optical facility 23 developed as a camera, of the further semiconductor chip to be picked up in the future on the substrate 11, for checking of the surface and the correct position.

As soon as the pivoting part 14 has finished its 180° rotation after a further 90°, the pickup of the further semiconductor chip is executed by the second vacuum pipette 20.

A second optical facility in the form of a die on the fly camera 25 is arranged for checking a flip offset of the previously rotated chip. In the event that there is a flip offset, this facility calculates corresponding correction data and passes this to the self-adjusting place element 21. The place element 21 then deposits the chip in an indexer 26, its position being checked by a further camera 27.

Figure 3:
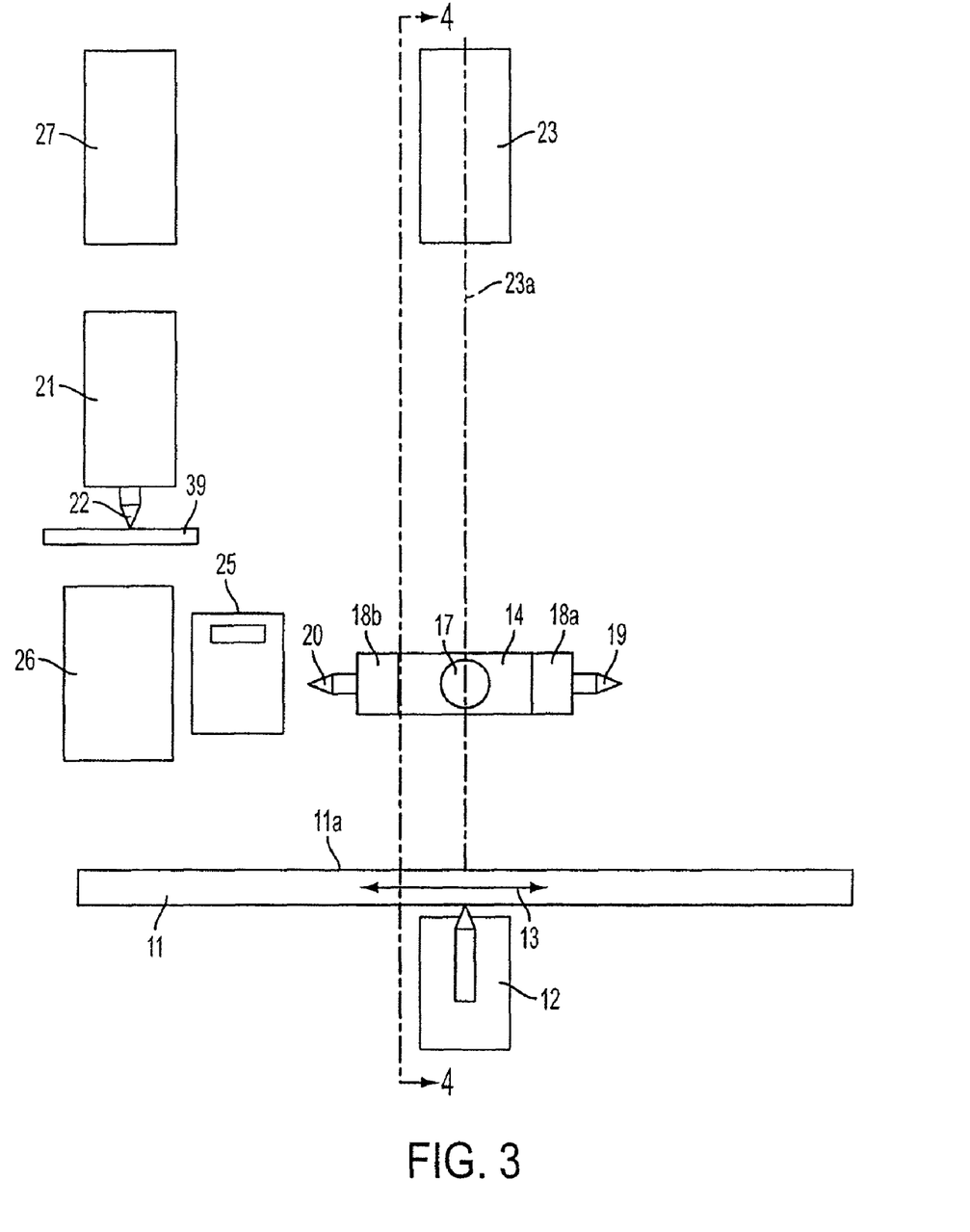
FIG. 3 is also a schematic front view of the device of FIG. 2, with the pivoting part rotated 90 degrees.

FIG. 3 shows the device of FIG. 2, where the pivoting part 14 is rotated 90 degrees. At this point, the placing facility 21 is moved (with a semiconductor chip) to a position over the indexer 26 and out of the optical path 23a. The optical path 23a is now unobstructed as it passes between the projections 18a, 18b of the pivoting part 14 to the surface of the substrate 11a.

Figure 4:
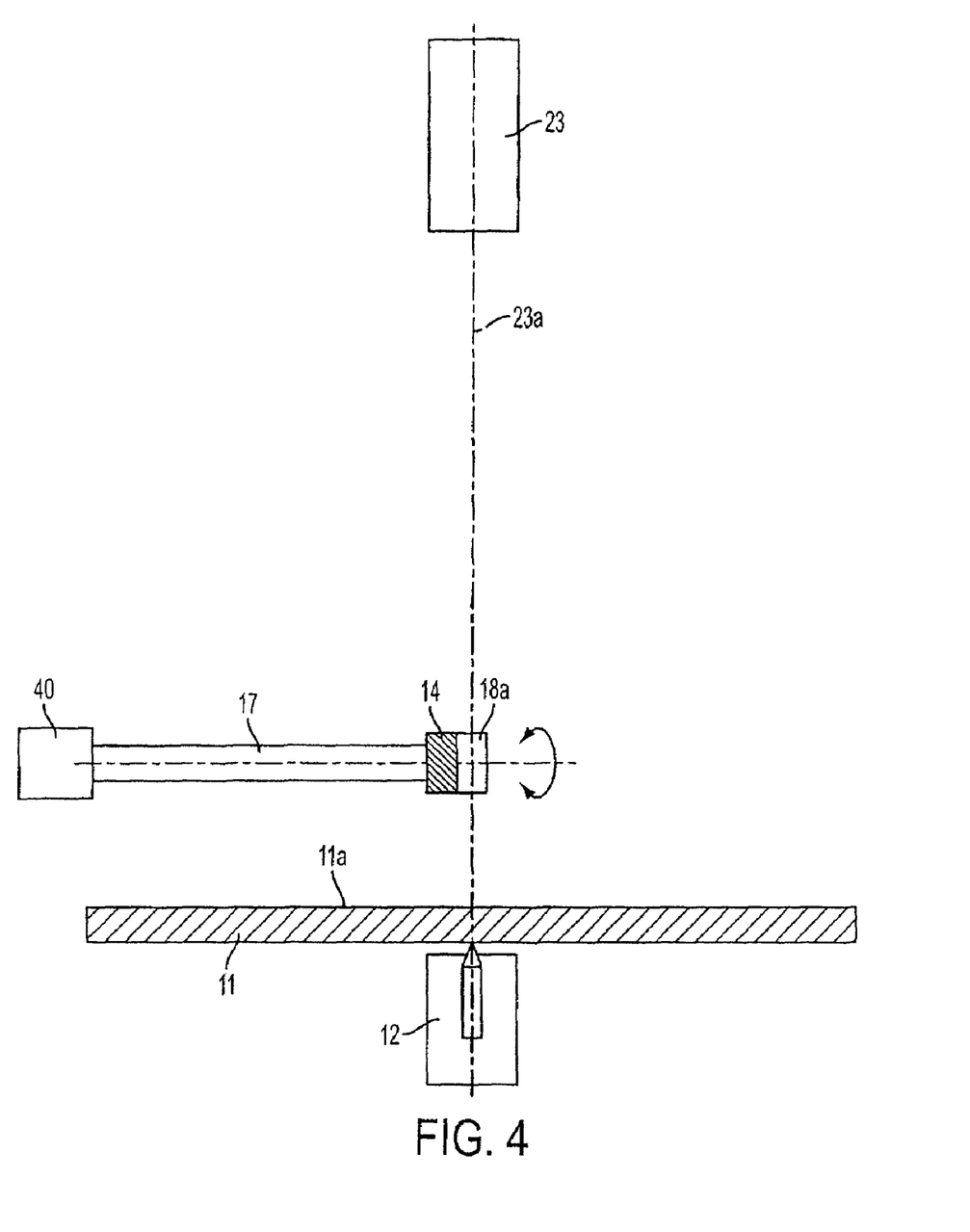
FIG. 4 is a schematic side view taken along line 4-4 of FIG. 3.

FIG. 4 is a side view of the device shown in FIG. 3. The pivoting part 14 is shown connected to the axis of the pivoting point 17 which is driven by motor 40 to rotate the pivoting part 14. It can be seen in FIG. 4 that the optical path 23a passes in front of the pivoting part 14 between the projections 18a, 18b, so that the camera may view the surface of the substrate 11a.

Figure 5:
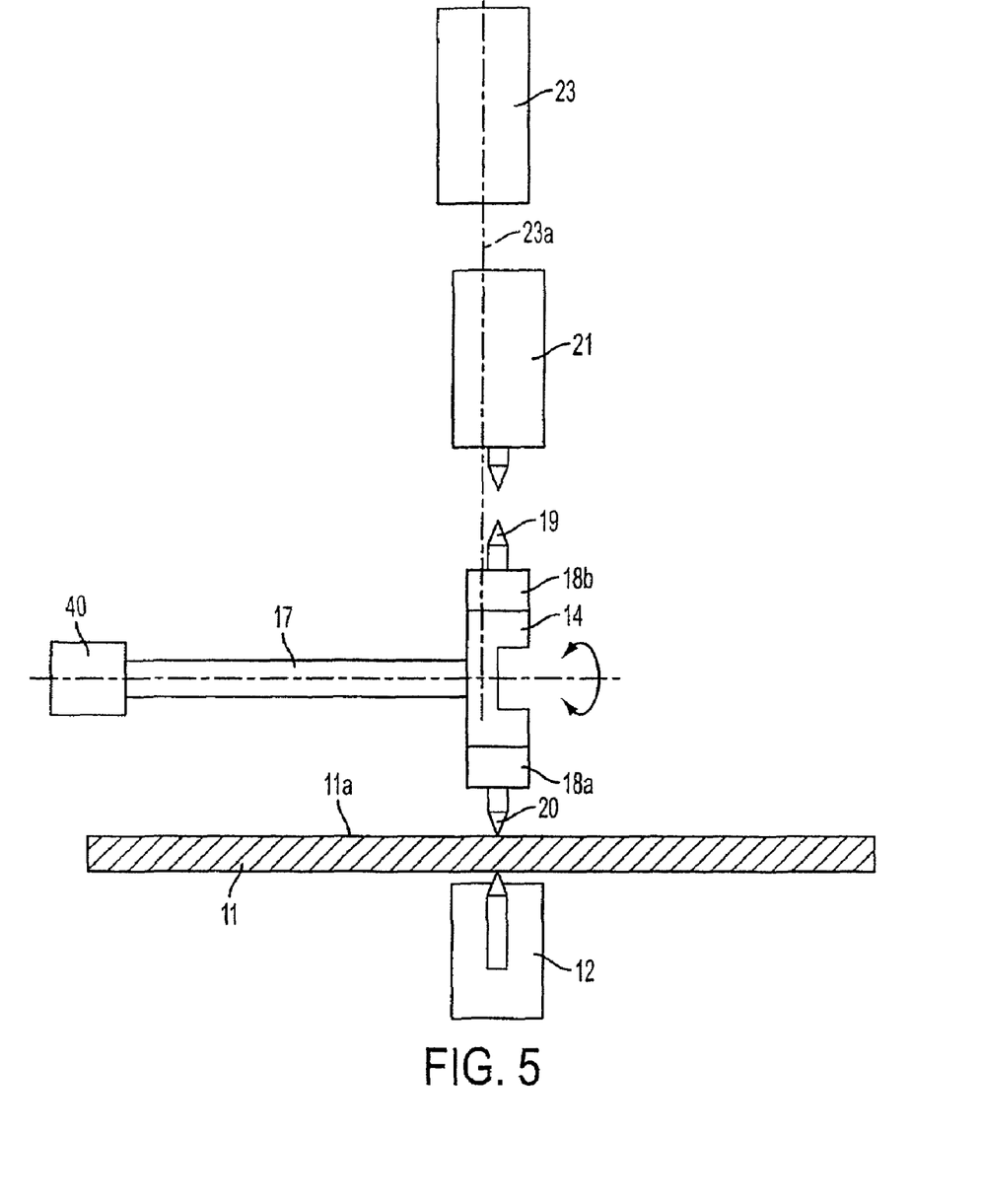
FIG. 5 is the schematic view of FIG. 4 with the pivoting part rotated 90 degrees.

FIG. 5 is the same view as in FIG. 4, except that the pivoting part 14 is rotated another 90 degrees. At the same time, placing facility 21 is returned to a position to pick up a semiconductor chip from the pickup element 19, thereby again blocking the optical path 23a.

Figure 6:
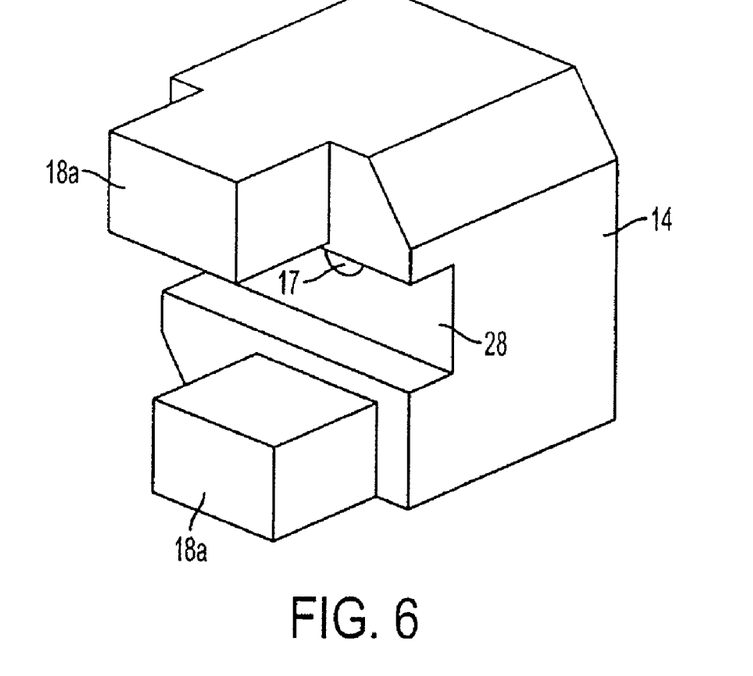
FIG. 6 in a perspective view, a pivoting part for the device for checking and rotating semiconductor chips according to an embodiment of the invention.

FIG. 6 shows in a perspective view a possible embodiment of a pivoting part 14 for its arrangement in a device according to the invention for checking and rotating electronic components. As can be seen from the representation, the pivoting part is equipped at its pivotal point 17 with a hole to accommodate a rotational axis, not shown here, around which the pivoting part 14 rotates.

The projections 18a and 18b developed as cheeks are used to accommodate and attach pickup elements, not shown here, which can be developed as vacuum pipettes, for example.

The through opening 28 is developed in this case as a through channel open on one long side, and milled into the part in a simple manner.

Figure 7:
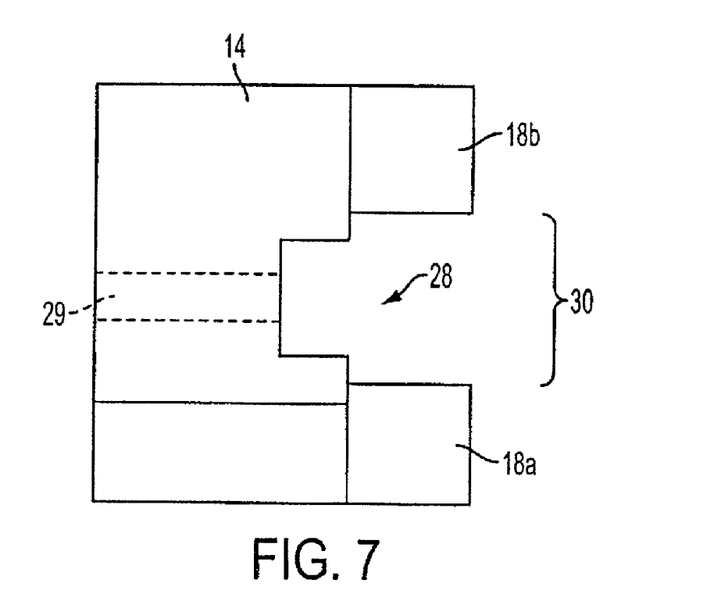
FIG. 7 in a schematic side view, the pivoting part shown in FIG. 6.

As can be seen from a side view of the pivoting part in FIG. 7, during its rotation around a rotational axis arranged in a drilled hole 29 the part 14 permits a maximum inspection window of a distance between the projections 18a and 18b.

This distance can have a dimension of about 20 mm, for example. In a further rotation beyond the 90° setting of the pivoting part 14, the inspection window then shrinks again, and vanishes entirely at a 180° setting of the pivoting part 14.

Figure 8:
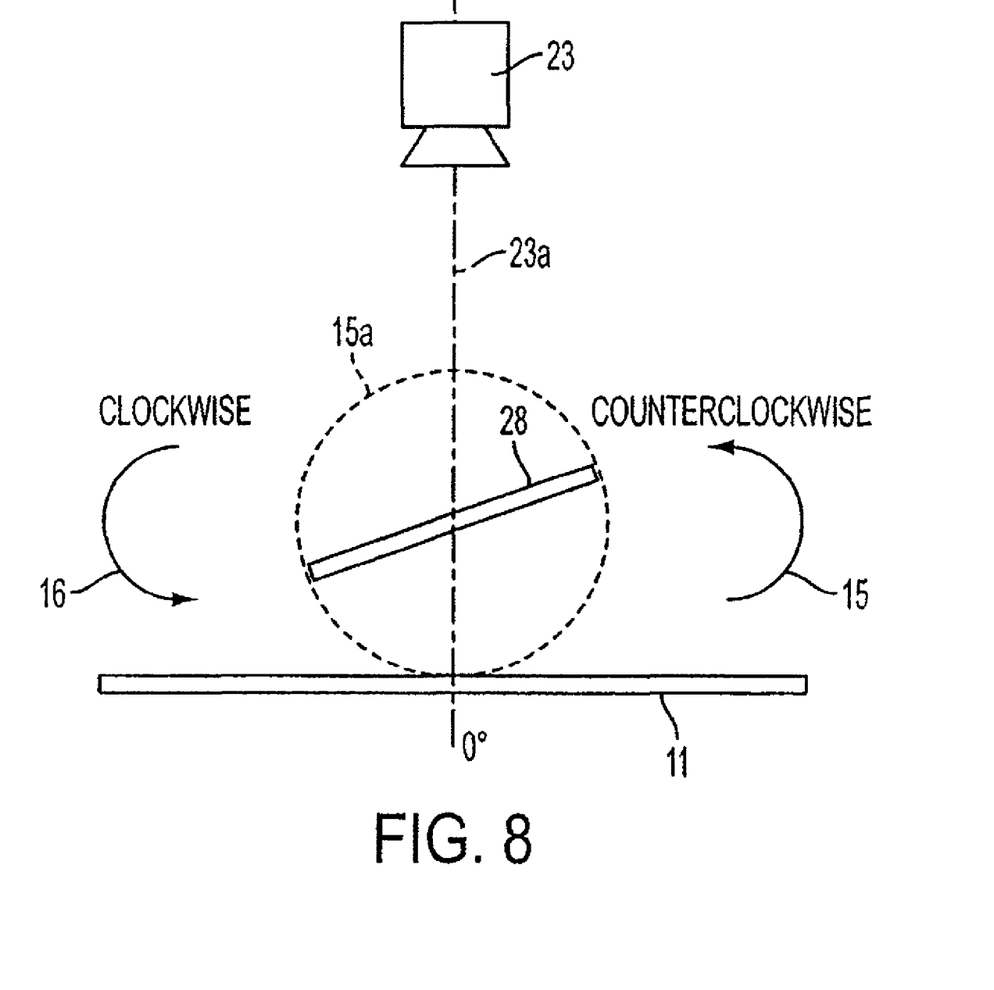
FIG. 8 in a schematic front view, a representation of the principle of the method according to the invention.

FIG. 8 shows in a simple schematic front view the functioning of the device according to the invention. The pivoting part, not shown here in detail, which is arranged between the camera 23 and the substrate 11, contains among other features the through opening 28, which moves in a circuit 15a.

As soon as the through opening 28 is in a vertical position, meaning that the pickup elements not shown here are aligned horizontally, the optical connection line 23a can be set up from the camera 23 to the semiconductor chip to be removed on the substrate 11. Within this brief swivelling in of the through opening 28 into the optical connection line 23a, a short-time recording takes place of the surface and the position of the semiconductor chip to be removed. A further rotation of the part in a counter-clockwise direction, as indicated by the arrow 15, allows the pickup element not shown here to sweep to the chip to be removed and pick it up. A 180° rotation of the part then takes place in the opposite direction, i.e. clockwise as indicated by the arrow 16. Alternatively, the pivoting part may complete a 360° rotation rather than reciprocating.

Figure 9:
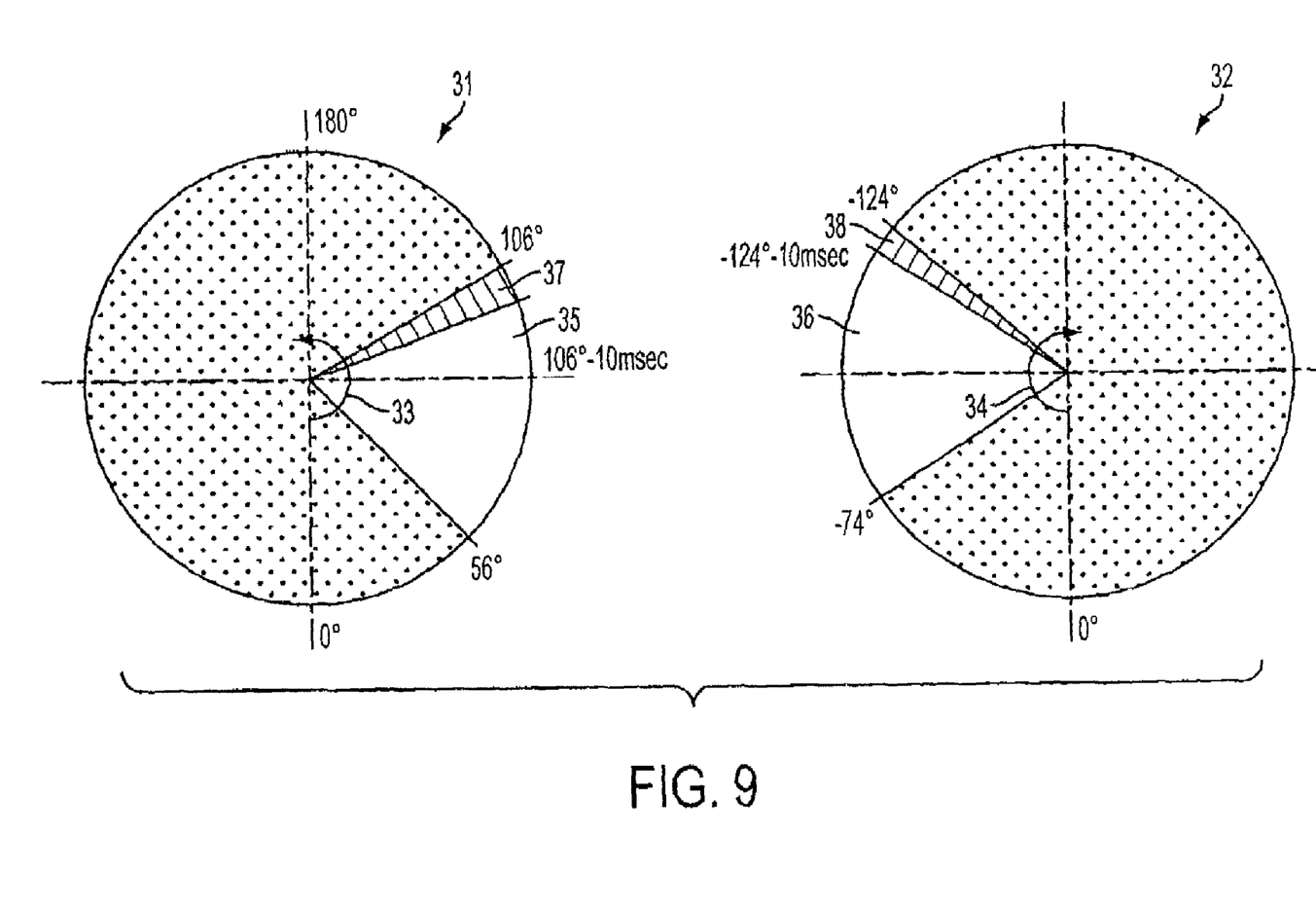
FIG. 9 in a schematic representation, checking areas for a through opening rotated to the left and to the right within the pivoting part.

In FIG. 9 there is a schematic representation of the observation/inspection areas that are available to the camera 23 during a rotation of the part 14 developed with the through opening 28. For a total 360° rotation of the part and the through opening counter-clockwise (reference label 31) and clockwise (reference label 32), as also indicated by arrows 33 and 34, available inspection areas 35 and 36 are formed at an approximate 90° setting of the part.

In order not to cause any blurred images in swivelling the through opening into the optical connection line between the camera and the wafer, the camera is activated with a time delay of about 10 msec, as represented by the angle sections 37 and 38.

All features disclosed in the application documents are claimed as essential for the invention, provided they are novel individually or in combination in the light of the prior art. All features disclosed in the application documents are regarded individually or in combination as essential for the invention. Variations of these are familiar to the person skilled in the art.

REFERENCE LABEL LIST 1, 11 Substrate
2, 12 Die ejector
3 Pivoting part
4, 17 Pivotal point
5 Flip head
6 Pickup element
7, 23 Wafer optics camera
8 Placing facility
9 Pickup element
11a Surface of the substrate
13 Direction of movement of the substrate
14 Pivoting part
15, 15a, 16 Rotational movement
18a, 18b First and second projections
19 First pickup element
20 Second pickup element
21 Placing facility
22 Vacuum pipette
23 Camera
23a Optical connection line
24 Direction of movement of the placing facility
25 Die on the fly camera
26 Indexer
27 Place optics camera
28 Through channel
29 Drilled hole
30 Maximum size of the inspection window
31, 32 Total rotation of the part
33, 34 Directions of rotation
35, 36 Inspection areas
37, 38 Angle sections
39 Semiconductor chip
40 Motor

The invention claimed is:

1. Method for checking and rotating electronic components, said method including the following steps:
   placing a pivoting part between a substrate and a first optical facility for checking a surface and a correct position of a single electronic component arranged on the substrate, said pivoting part having a first pickup element arranged thereon, a second pickup element arranged externally opposite the first pickup element on the pivoting part, and a through opening arranged in the pivoting part between said first and second pickup elements;
   picking up individually a first electronic component from a sandwich of electronic components arranged on the substrate, using the first pickup element; and
   depositing said electronic component in a rotated position, wherein during a 180° rotation of the pivoting part the following additional steps occur:
      picking up a single electronic component arranged on the substrate by the first pickup element;
      checking a surface and a correct position of a further electronic component arranged on the substrate, by means of the optical facility via the through opening; and
      depositing of the electronic component held by the first pickup element on a placing facility after a 180° rotation of the pivoting part, and at the same time a further pickup of the further individual electronic component arranged on the substrate, by the second pickup element.

2. Method according to claim 1, wherein, after the 180° rotation a 180° rotation in the opposite direction is executed.

3. Method according to claim 1, wherein, by means of a second optical facility, a correct position of the turned and deposited component is checked and adjusted during or after a transporting of the turned and deposited component.

4. Method according to claim 1, wherein, the first optical facility is activated with a predefinable time delay after a rotation of the through opening into an optical connection line between the first optical facility and the electronic component still arranged on the substrate.

5. Method according to claim 1, wherein said electronic components are flip chips.

6. Method according to claim 1, wherein said pivoting part is rotated about an axis of rotation substantially parallel to the surface of the substrate.

7. Method according to claim 6, including the steps of providing said two pickup elements substantially 180° from each other with respect to the axis of rotation of the pivoting part and facing opposite each other,
   said pivoting part with said through opening arranged between the pickup elements such that an unobstructed optical path from the optical inspection device to the inspection area on the substrate is presented during the rotation of the pivoting part for some portion of a rotation of 180°.

8. Method according to claim 7, including the step of inspecting the inspection area on the substrate via the through opening between the pickup elements along an unobstructed optical path from the optical inspection device to the inspection area on the substrate during the rotation of the pivoting part for some portion of a rotation of 180°.

9. Method according to claim 1, including the step of providing said first pickup element on a first projection and the second pickup element on a second projection of the pivoting part.

10. Method according to claim 9, wherein the step of providing the through opening is developed between the first and second projections as a through channel open on one long side.

11. Method according to claim 1, including the steps of:
   providing the through opening in the pivoting part such that the through opening is facing the substrate when rotating the first or second pickup elements of the pivoting part through 90° or 270° and during the 180° rotation of the pivoting part;
   picking up the single electronic component from the substrate by the first pickup element, and, after a rotation through a first 90° rotation of the first or second pickup elements;
   providing an optical connection line between the first optical inspection device and a second electronic component arranged on the substrate through the vertically aligned through opening;
   depositing the single electronic component on a placing facility arranged relocatably above the pivoting part with the single electronic component turned around after an executed 180° rotation; and
   picking up the further electronic component from the substrate by the second pickup element when the further pickup element is facing the substrate.

12. Method according to claim 1, wherein after the 180° rotation the pivoting part completes a 360° rotation.

13. Method for checking and rotating electronic components, the method comprising:
   providing a substrate;
   providing a first optical facility for checking a surface and a position of the single electronic component;
   providing a pivoting part between the substrate and the first optical facility, the pivoting part having a first pickup element at a first end, a second pickup element at a second end opposite the first end, first and second sides between the first and second ends, and an opening extending through the pivoting part from the first side to the second side;
   picking up individually a first electronic component from a plurality of electronic components arranged on the substrate, using the first pickup element;
   rotating said pivoting part from a first position to a second position, and during said rotating;
   checking a surface and a correct position of a second individual electronic component arranged on the substrate via the opening; and
   depositing the first electronic component held by the first pickup element on a placing facility after a 180° rotation of the pivoting part, and at substantially the same time a picking up the second individual electronic component using the second pickup element.

14. Method according to claim 13, wherein said opening comprises a notch.

* * * * *